(12) United States Patent
Yamada

(10) Patent No.: US 7,184,083 B2
(45) Date of Patent: Feb. 27, 2007

(54) SOLID STATE IMAGE PICKUP APPARATUS OF LOW POWER CONSUMPTION AND ITS DRIVING METHOD

(75) Inventor: Tetsuo Yamada, Miyagi (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 699 days.

(21) Appl. No.: 10/219,274

(22) Filed: Aug. 16, 2002

(65) Prior Publication Data

US 2003/0038890 A1 Feb. 27, 2003

(30) Foreign Application Priority Data

Aug. 21, 2001 (JP) ............................. 2001-249909

(51) Int. Cl.
- H04N 5/335 (2006.01)
- H04N 3/14 (2006.01)
- H01L 27/00 (2006.01)
- H01L 27/148 (2006.01)
- H01L 31/062 (2006.01)

(52) U.S. Cl. .................. 348/294; 348/311; 250/208.1; 257/215; 257/291

(58) Field of Classification Search ...................... None
See application file for complete search history.

(56) References Cited

U.S. PATENT DOCUMENTS

| | | | | |
|---|---|---|---|---|
| 4,663,771 A | * | 5/1987 | Takeshita et al. ........... | 257/243 |
| 5,189,498 A | * | 2/1993 | Sakakibara ................. | 257/249 |
| 5,293,237 A | * | 3/1994 | Yonemoto ................... | 348/314 |
| 5,313,080 A | * | 5/1994 | Jung .......................... | 257/223 |
| 5,902,995 A | * | 5/1999 | Morimoto ................ | 250/208.1 |
| 6,081,015 A | * | 6/2000 | Kamimura .................. | 257/360 |
| 6,104,072 A | * | 8/2000 | Hirota ........................ | 257/215 |
| 6,111,279 A | * | 8/2000 | Nakashiba .................. | 257/222 |
| 6,191,817 B1 | * | 2/2001 | Kanbe ........................ | 348/299 |

FOREIGN PATENT DOCUMENTS

| | | | |
|---|---|---|---|
| JP | 03-169027 | A | 7/1991 |
| JP | 05-103272 | A | 4/1993 |
| JP | 2000-101922 | A | 4/2000 |
| JP | 2000-261726 | A | 9/2000 |
| JP | 2001-028715 | A | 1/2001 |
| JP | 2001-036818 | * | 2/2001 |
| JP | 2001-36818 | | 2/2001 |
| JP | 2001-036818 | A | 2/2001 |

* cited by examiner

Primary Examiner—David Ometz
Assistant Examiner—Nhan Tran
(74) Attorney, Agent, or Firm—Arent Fox PLLC

(57) ABSTRACT

A charge transfer device whose output end is electrically connected to a charge detector circuit is driven by negative pulse voltage trains to reduce power consumption of the charge detector circuit.

14 Claims, 14 Drawing Sheets

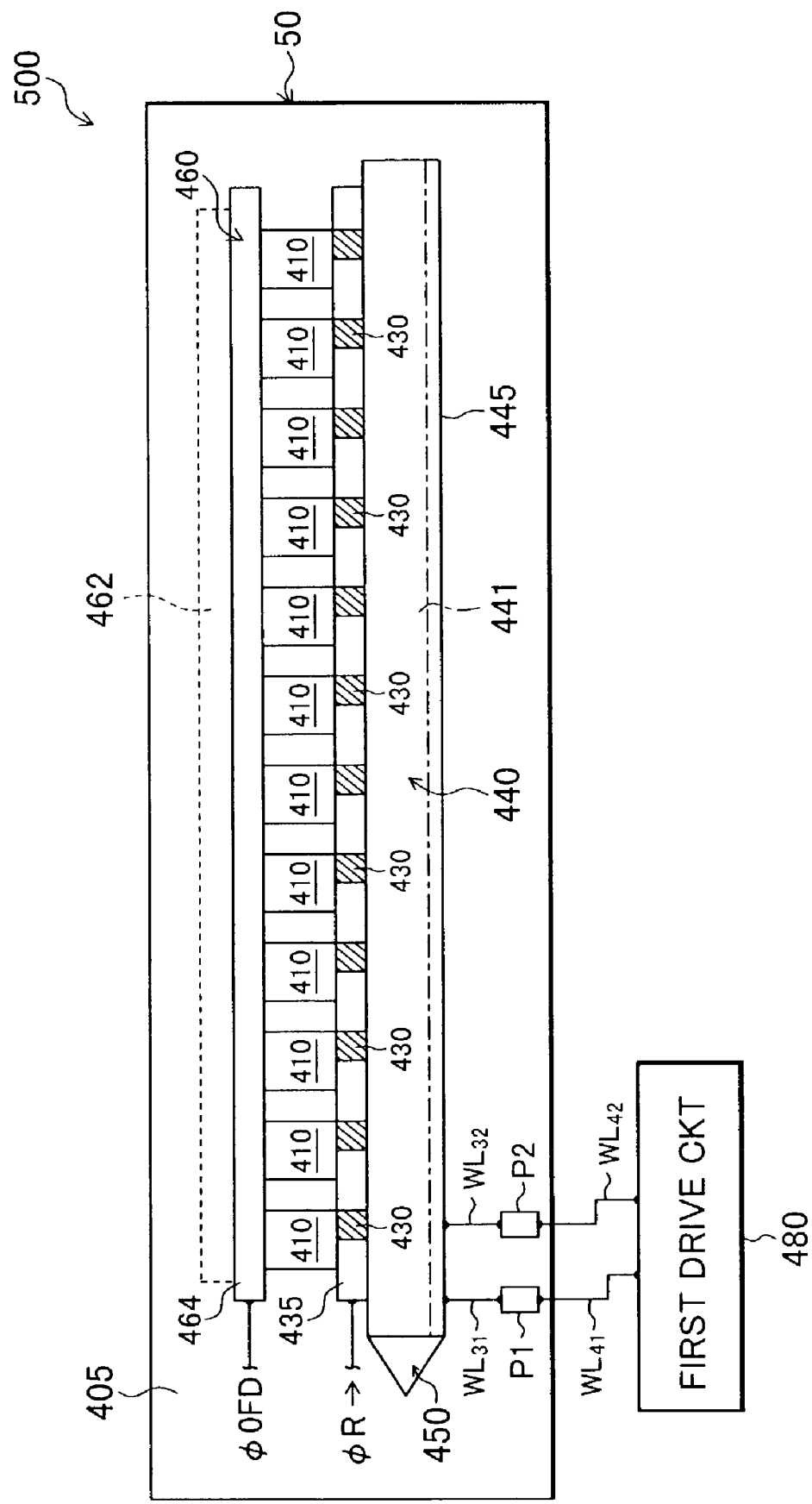

SOLID STATE IMAGE PICKUP APPARATUS OF LOW POWER CONSUMPTION AND ITS DRIVING METHOD

CROSS REFERENCE TO RELATED APPLICATION

This application is based on Japanese Patent Application No. 2001-249909, filed on Aug. 21, 2001, the entire contents of which are incorporated herein by reference.

BACKGROUND OF THE INVENTION

A) Field of the Invention

The present invention relates to charge transfer devices made of charge coupled devices (CCD's), their driving method and a solid state image pickup device having charge transfer devices.

B) Description of the Related Art

CCD can be formed, for example, by forming a stripe shaped n-type channel in a surface layer of a p-type region formed in a semiconductor substrate and disposing a plurality of electrodes (transfer electrodes) traversing the n-type channel as viewed in plan on the semiconductor substrate.

By controlling the value of a voltage applied to each transfer electrode of CCD, it is possible to control the potential profile of the n-type channel. Charges distributed in the n-type channel can be transferred to the region under a desired transfer electrode by controlling the voltage values applied to respective transfer electrodes. Namely, charges in the n-type channel can be transferred in a desired direction.

In order to make a charge transfer device transfer charges in a desired direction at high speed and with low transfer loss, it is desired to suppress energy levels, which may become capture levels of charges, from being formed in the n-type channel. For example, if the crystallinity of a semiconductor surface is irregular, energy levels allowing charges to reside may be formed in the forbidden band in which electrons do not exist otherwise. Such energy levels may become capture levels.

In order to avoid the formation of capture levels, a buried channel structure is generally adopted to CCD-type charge transfer devices. Basically, an electrically insulating layer is formed on the n-type channel, and transfer electrodes are formed on this electrically insulating layer. In the buried channel, the energy of carriers in the surface layer is set high in order to transfer carriers only in the bulk region deeper than the surface layer. To this end, the potential of the buried channel is set always higher than the potential of the transfer electrodes by properly selecting the n-type impurity concentration of the n-type channel, the p-type impurity concentration of a p-type region at the periphery of the n-type channel, and the thickness of the electrically insulating layer.

In this embodiment, "potential" and "voltage" of an n-type channel or an electrode are intended to mean potential and voltage which are defined by utilizing as a reference the potential of the p-type region at the periphery of the n-type channel.

When a high negative voltage is applied to a charge transfer device having an n-type buried channel, holes are induced in the surface layer of the n-type channel to form an inverted layer to such an extent that the potential of the n-type channel cannot be controlled by a voltage applied to the transfer electrode. From this reason, the charge transfer device having the n-type buried channel is generally driven by positive pulse voltage trains.

All charge transfer devices made of CCD's, particularly CCD's of a two-phase drive type, are driven by positive pulse voltage trains. In a two-phase drive type CCD, in order to determine a transfer direction of charges in the channel, a region (accumulation region) having a high impurity concentration and a region (barrier region) having a low impurity concentration are alternately formed in the channel.

If a charge transfer device is driven by positive pulse voltage trains, there is the advantage that a gate protection circuit can be formed easily. The gate protection circuit protects gates including transfer gates from electrostatic breakdown.

For example, a gate protection circuit can be formed by grounding the gate and source of a MOS type field effect transistor and connecting the drain to a bus line. If the charge transfer device is driven by positive pulse voltage trains, grounding the gate and source of a MOS type field effect transistor of the gate protection circuit can be realized by connecting the gate and source to the p-type region at the periphery of the n-type channel.

As an exception, negative pulse voltage trains are used for driving the vertical charge transfer devices (VCCD) of a CCD type solid state image pickup apparatus of the type that portions of transfer electrodes are used as the read gates for controlling to read charges from photoelectric conversion elements.

Such a solid state image pickup apparatus is utilized as an area image sensor. A number of photoelectric conversion elements are disposed on one surface of a semiconductor substrate in a plurality of rows and columns and in a matrix shape. For example, one vertical charge transfer device (VCCD) per one photoelectric conversion element column is disposed along this column. A horizontal charge transfer device (HCCD) driven by positive pulse voltage trains is electrically connected to the output end of each of vertical charge transfer devices (VCCD's), and a charge detector circuit is electrically connected to the output end of the horizontal charge transfer device.

When charges accumulated in each photoelectric conversion element are read to the vertical charge transfer device, a read pulse of a positive potential (e.g., 15 V) is applied to a predetermined transfer electrode constituting the vertical charge transfer device. When the charges read by the vertical charge transfer device are transferred toward the horizontal charge transfer device, the vertical charge transfer device is driven by negative pulse voltage trains in order to prevent charges once read from flowing in a reverse direction toward the photoelectric conversion elements and prevent charges from being read from undesired photoelectric conversion elements. For example, the negative pulse voltage train is −7 V at a low level and 0 V at a high level.

As compared to additionally forming read gate electrodes, the integration degree of photoelectric conversion elements can be increased more easily by utilizing as the read gates the transfer gates of the vertical charge transfer device. It is easy to form an area image sensor having a good resolution.

As compared to connecting a gate protection circuit to a charge transfer device driven by positive pulse voltage trains, it becomes complicated to form the gate protection circuit if the gate protection circuit is connected to the vertical charge transfer device of the type described above.

Namely, since the gate and source of a MOS type field effect transistor of the gate protection circuit are grounded, it is necessary to form a second p-type region different from the p-type region at the periphery of the n-type channel and to apply a negative bias voltage to the second p-type region.

If the resolution of an area image sensor is to be improved with a priority over such requirements, vertical charge transfer devices driven by negative pulse voltage trains are used.

In transferring charges from the vertical charge transfer devices to the horizontal charge transfer device, it is necessary to set the channel potential of the regions of the horizontal charge transfer device where charges are received, higher than the channel potential of the vertical charge transfer devices.

For example, the channel potential is about 8 to 9 V when the high level (0 V) voltage is applied to the vertical charge transfer device driven by the negative pulse voltage trains. It is therefore necessary to set the channel potential of the region of the horizontal charge transfer device where charges are received, for example, to about ten and several V.

The horizontal charge transfer device is therefore driven by positive pulse voltage trains of, for example, 3 to 5 V of the high level potential and 0 V of the low level potential. When charges from the vertical charge transfer device are received, a high level voltage is applied to a predetermined transfer electrode of the horizontal charge transfer device.

Similarly, when charges are transferred from the horizontal charge transfer device to the charge detector circuit, it is necessary to set the potential of the charge detector circuit higher than the channel potential of the horizontal charge transfer device.

For example, the charge detector circuit has a floating diffusion region (hereinafter abbreviated to "FD region"), a reset transistor and a source follower. The FD region is electrically connected via an output gate to the output end of the horizontal charge transfer device. The reset transistor has the FD region as its source region, and the source follower is connected to the FD region.

By opening and closing the gate of the reset transistor, the potential of the FD region is set to a reference potential, and charges are transferred from the horizontal charge transfer device via the output gate to the FD region set to the reference potential.

When charges are sent from the horizontal charge transfer device to the FD region, a low level voltage is applied to the transfer electrode at the output end of the horizontal charge transfer device so that the channel potential under the transfer electrode becomes, for example, 7 to 8 V. The reference potential of the FD region is set to have a value, e.g., 12 to 15 V sufficiently higher than the channel potential (e.g., 7 to 8 V) at the output end of the horizontal charge transfer device when the charges are output, in order to allow charges to be received from the horizontal charge transfer device and in order to have a sufficient output dynamic range of the charge detector circuit.

Voltage used for setting the potential of the FD region to the reference potential is generally used as an input to the source follower circuit. Therefore, the power source voltage of the source follower circuit is, for example, 12 to 15 V.

By using this power source voltage, the source follower circuit generates a voltage signal corresponding to a change amount in the potential of the FD region to be caused by the transfer of charges from the horizontal charge transfer device, amplifies this voltage signal and outputs it.

Relatively large current is flowed through the source follower circuit in order to obtain a current capacity sufficiently large for an external load. For example, if the charge transfer rate (signal data rate) from the horizontal charge transfer device to the charge detector circuit is about 20 MHz, a current of about 8 mA is usually flowed through the source follower circuit. A consumption power reduced from this current is about 96 mW.

A low consumption power is desired for a solid state image pickup apparatus assembled in a compact mobile apparatus such as a portable phone. It is not preferable to consume a power of about 100 mW only by the charge detector circuit of a solid state image pickup apparatus.

SUMMARY OF THE INVENTION

An object of this invention is to provide a solid state image pickup apparatus capable of easily reducing a consumption power.

Another object of the invention is to provide a driving method for a solid image pickup apparatus capable of easily reducing a consumption power.

According to one aspect of the present invention, there is provided a solid state image pickup apparatus comprising: a semiconductor substrate; a number of photoelectric conversion elements formed in one surface of the semiconductor substrate; a charge transfer device for receiving charges accumulated in each of said photoelectric conversion elements and transferring them, having an output end; a charge detector circuit connected to the output end; wherein transfer device is adapted to be driven by negative pulse voltage trains of a plurality of phases each having a negative low level potential to transfer the charges to the charge detector circuit.

According to another aspect of the present invention, there is provided a solid state image pickup apparatus comprising: a semiconductor substrate; a number of photoelectric conversion elements formed in one surface of said semiconductor substrate, each of said photoelectric conversion elements accumulating charges corresponding to an amount of incidence light; a first charge transfer device for receiving charges accumulated in each of said photoelectric conversion elements and transferring the charges in a predetermined direction by being driven by pulse voltage trains of a plurality of phases, said first charge transfer device comprising: an electrically insulating film formed on the surface of said semiconductor substrate; a plurality of transfer electrodes disposed in line on the insulating film, said transfer electrodes being classified into a plurality of groups and connected in common in groups; and an n-type charge transfer channel formed in the surface of said semiconductor substrate and traversing each of said transfer electrodes, a concentration of conductivity-determining impurity in said charge transfer channel being set to such a level that a potential of said charge transfer channel takes a pinning potential when a predetermined negative voltage is applied to said transfer electrodes; a charge detector circuit electrically connected to an output end of said first charge transfer device for detecting charges output from said first charge transfer device and generating an electrical signal; and a first drive circuit for generating pulse voltage trains of a plurality of phases each taking the predetermined negative voltage or a negative voltage near the predetermined negative voltage as a low level.

According a further aspect of the present invention, there is provided a driving method for a solid state image pickup apparatus comprising a number of photoelectric conversion elements formed on one surface of a semiconductor substrate; and a charge transfer device whose output end is connected to a charge detector circuit, the charge transfer device receiving charges accumulated in each of the photoelectric conversion elements and being driven by negative pulse voltage trains of a plurality of phases each having a negative low level potential to transfer the charges to the charge detector circuit, the driving method comprising the steps of: generating negative pulse voltage trains of a plurality of phases each having a negative voltage as a low level voltage; and supplying the charge transfer device with the negative pulse voltage of a plurality of phases.

According to a further aspect of the present invention, there is provided a driving method for a solid state image pickup apparatus comprising: a semiconductor substrate; a number of photoelectric conversion elements formed in one surface of the semiconductor substrate, each of the photoelectric conversion elements accumulating charges corresponding to an amount of incidence light; a first charge transfer device for receiving charges accumulated in each of the photoelectric conversion elements and transferring the charges in a predetermined direction by being driven by pulse voltage trains of a plurality of phases, the first charge transfer device comprising a plurality of transfer electrodes disposed in line on an electrically insulating film formed above the surface of the semiconductor substrate, the transfer electrodes being classified into a plurality of groups and connected in common in groups, and an n-type charge transfer channel formed in the surface of the semiconductor substrate and traversing each of the transfer electrodes, a concentration of conductivity-determining impurity of the charge transfer channel being set to a predetermined concentration; a charge detector circuit electrically connected to an output end of the first charge transfer device for detecting charges output from the first charge transfer device and generating an electrical signal, the driving method comprising the steps of: generating negative pulse voltage trains of a plurality of phases each having as a low level voltage a predetermined negative voltage or a negative voltage near the predetermined negative voltage so that a potential of the charge transfer channel takes a pinning potential when the low level voltage is applied to the transfer electrode; and supplying the negative pulse voltage trains of a plurality of phases to the transfer electrodes, each negative pulse voltage train being supplied to the transfer electrodes of a different group.

The channel potential at the output end of the charge transfer device when charges are transferred from the charge transfer device to the charge detector circuit can be lowered by driving the charge transfer device having the output end electrically connected to the charge detector circuit by using negative pulse voltage trains, than by driving the charge transfer device by using positive pulse voltage trains.

It is therefore possible to lower the reference voltage used for detecting charges at the charge detector circuit. If the charge detector circuit has a source follower circuit, an input voltage to the source follower circuit can be lowered. It is therefore possible to reduce a consumption power of the charge detector circuit.

A solid image pickup apparatus capable of reducing a consumption power of the charge detector circuit is provided. It is easy to provide a solid state image pickup apparatus capable of operating a long time if it is assembled in a compact mobile apparatus such as a portable phone.

BRIEF DESCRIPTION OF THE DRAWINGS

FIG. 14 is a schematic diagram showing a solid state image pickup apparatus according to a fifth embodiment.

DESCRIPTION OF THE PREFERRED EMBODIMENTS

Figure 1:
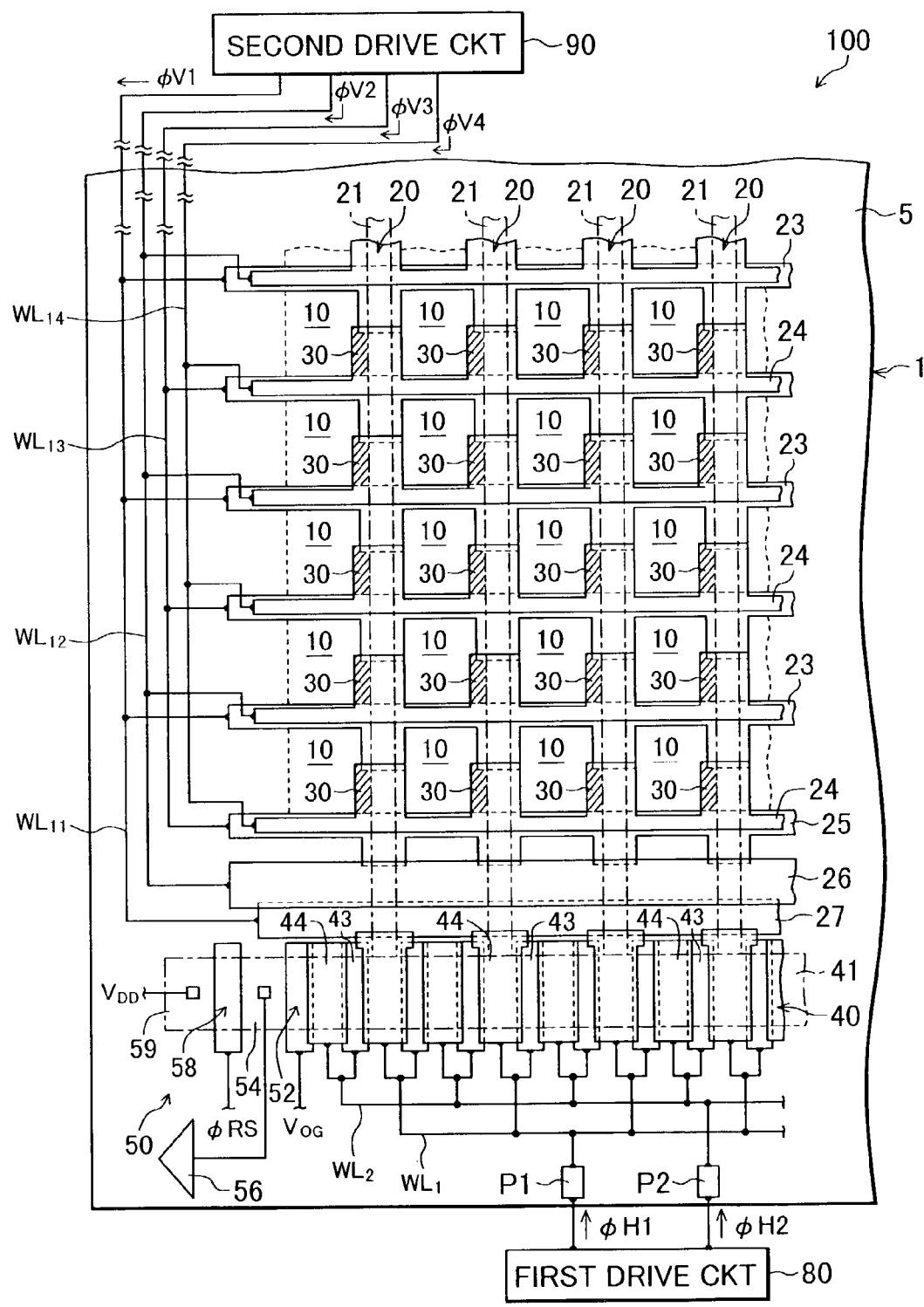
FIG. 1 is a diagram showing the outline of a solid image pickup apparatus according to a first embodiment.

FIG. 1 is a schematic diagram showing a solid state image pickup apparatus according to the first embodiment. The solid image pickup apparatus 100 has a solid state image pickup device 1 used as an area image sensor, and first and second drive circuits 80 and 90 for generating pulse signals (pulse voltages) necessary for driving the solid state image pickup device 1.

The solid state image pickup device 1 is formed on an n-type semiconductor substrate 5 having a p-type well in its surface layer. In the p-type well of the semiconductor substrate 5, a number of photoelectric conversion elements 10 are disposed in a plurality of rows and columns and in a matrix shape. Each photoelectric conversion element 10 is constituted of a buried type photodiode formed, for example, by forming an n-type region in the p-type well and forming a p-type region in the surface layer of the n-type region. The total number of photoelectric conversion elements is as small as several hundred thousands and as large as six millions.

A vertical charge transfer device 20 of a charge coupled device (CCD) type is disposed in each photoelectric conversion element column. Each vertical charge transfer device 20 has an n-type vertical charge transfer channel 21 formed in the p-type well of the semiconductor substrate 5 and a number of transfer electrodes 23 and 24 disposed on an electrically insulating film above the semiconductor substrate 5.

A first vertical transfer electrode 23 made of a lower level polysilicon layer and a second vertical transfer electrode 24 made of an upper level polysilicon layer are disposed in each photoelectric conversion element row. Three auxiliary transfer electrodes 25, 26 and 27 are disposed downstream relative to the most downstream second vertical transfer electrode 24.

In this specification, a path of charges from each photoelectric conversion element to a charge detector circuit to be later described is regarded as a flow, and the relative position of each component and the like is defined by using the terms "upstream relative to, or on the upstream side", "downstream relative to, or on the downstream side" and the like when necessary.

Each second vertical transfer electrode 24 also constitutes a read gate 30 for controlling to read charges from the corresponding photoelectric conversion element 10 to vertical charge transfer device 20. In FIG. 1, each read gate 30 is shown hatched.

Every fourth transfer electrode is connected in common by wiring lines $WL_{11}$, $WL_{12}$, $WL_{13}$ or $WL_{14}$ and supplied with negative pulse voltage trains $\phi V1$, $\phi V2$, $\phi V3$ or $\phi V4$ from the second drive circuit 90. Each negative pulse voltage train $\phi V1$ to $\phi V4$ has, for example, the low level of −7 V and the high level of 0 V.

When charges are read from each photoelectric conversion element 10 to the vertical charge transfer device 20, a read pulse is superposed upon the negative pulse voltage train $\phi V1$ or $\phi V4$. The potential of the read pulse is, for example, 15 V.

The vertical charge transfer device 20 is driven by the negative pulse voltage trains $\phi V1$ to $\phi V4$ to transfer charges toward the horizontal charge transfer device 40.

The horizontal charge transfer device 40 is made of a CCD and disposed so as to be electrically connected to output ends of the vertical charge transfer devices 20. The horizontal charge transfer device 40 has an n-type horizontal charge transfer channel 41 formed in the p-type well of the semiconductor substrate 5, and a number of horizontal transfer electrodes 43 and 44 formed on the electrically insulating film above the semiconductor substrate 5.

In the example shown in FIG. 1, a second horizontal transfer electrode 44 made of the upper level polysilicon layer and a first horizontal transfer electrode 43 made of the lower level polysilicon layer are alternately disposed in this order from the downstream side to upstream side, two electrodes being connected in common. Four horizontal transfer electrodes 43 and 44 are assigned to one vertical charge transfer device 20.

A pair of horizontal transfer electrodes 43 and 44 on the upstream side of one vertical charge transfer device 20 is connected by a wiring line $WL_1$ and supplied with a negative pulse voltage train $\phi H1$ via a pad P1 from the first drive circuit 80. A pair of horizontal transfer electrodes 43 and 44 on the downstream side is connected by a wiring line $WL_2$ and supplied with a negative pulse voltage train $\phi H2$ via a pad P2 from the first drive circuit 80. The horizontal charge transfer device 40 is driven by the negative pulse voltage trains $\phi H1$ and $\phi H2$ to transfer charges received from each vertical charge transfer device 20 toward the left side charge detector circuit 50.

The charge detector circuit 50 has: an output gate 52 connected to the output end of the horizontal charge transfer device 40; an n-type floating diffusion (FD) region 54 formed in the p-type well of the semiconductor substrate 5 adjacent to the output gate 52; a two-stage source follower circuit (floating diffusion amplifier (hereinafter abbreviated to "FDA")) 56 electrically connected to the FD region 54: and a reset transistor 58 for using the FD region 52 as source region.

The output gate 52 is supplied with a d.c. voltage $V_{OG}$ to transfer charges from the horizontal charge transfer device 40 to the FD region 52.

An amount of charges in the FD region 54 is converted into a voltage signal by a capacitor, and FDA 56 amplifies this voltage signal and outputs it. This FDA 56 is also formed in the semiconductor substrate 5.

The reset transistor 58 is driven by a drive signal $\phi RS$ to be electrically connected to the FD region 54 and drain region 59 and to set the voltage at the FD region 54 and drain region 59, for example, to a power source voltage $V_{DD}$. In this case, charges in the FD region are drained to the drain region 59 and absorbed by the power source voltage $V_{DD}$.

A light shielding film covering the area other than the photoelectric conversion elements 10 as viewed in plan is disposed above the structure shown in FIG. 1 to prevent unnecessary photoelectric conversion. When necessary, a color filter of a predetermined color and a micro lens are disposed above each photoelectric conversion element 10.

The negative voltage pulse trains $\phi H1$ and $\phi H2$ drive the horizontal charge transfer device 40. Each of the negative pulse voltage trains $\phi H1$ and $\phi H2$ has, for example, the low level of −3 V and the high level of 0 V. The negative pulse voltage trains $\phi H1$ and $\phi H2$ have opposite phases.

Figure 2:
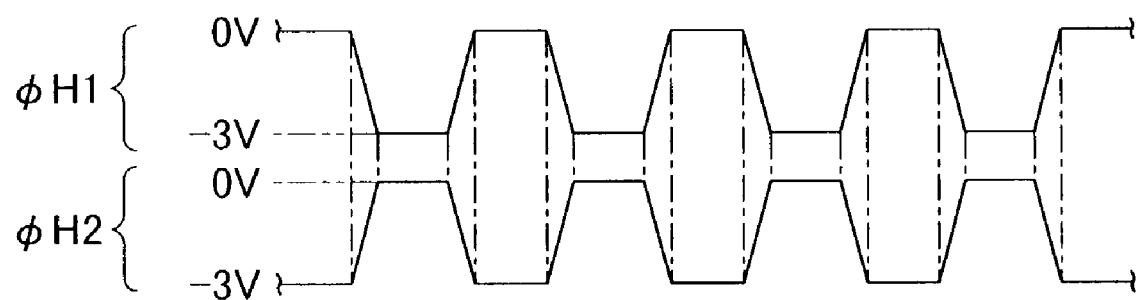
FIG. 2 is a schematic diagram showing the waveforms of two-phase negative pulse voltage trains φH1 and φH2 for driving a horizontal charge transfer device constituting the solid state image pickup apparatus shown in FIG. 1.

FIG. 2 shows the waveforms of negative pulse voltage trains $\phi H1$ and $\phi H2$. In the horizontal charge transfer device 40 driven by the negative pulse voltage trains $\phi H1$ and $\phi H2$, an effective n-type impurity concentration of the horizontal charge transfer channel 41 is set lower than that of the horizontal charge transfer channel driven by positive pulse voltage trains.

Figure 3:
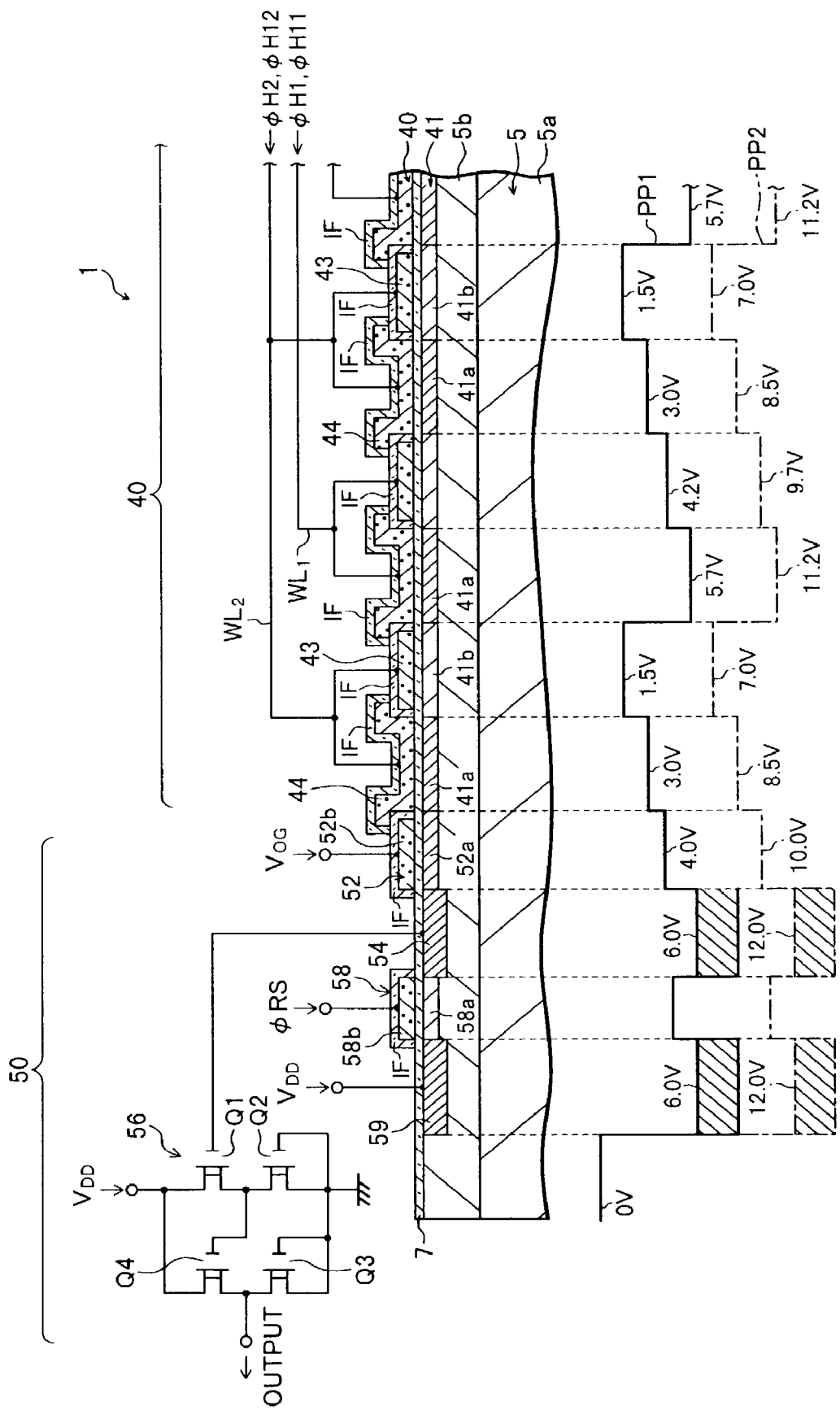
FIG. 3 is a cross sectional view showing the structure of the solid state image pickup apparatus from the horizontal charge transfer element to a charge detector circuit shown in FIG. 1 and a schematic diagram of a potential profile.

FIG. 3 is a schematic cross sectional view of the region from the horizontal charge transfer device 40 to charge detector circuit 50 and shows a potential profile. In FIG. 3, elements similar to those shown in FIG. 1 are represented by using identical reference numerals, and the description thereof is omitted.

A semiconductor substrate 5 has an n-type semiconductor substrate 5a and a p-type well 5b formed in one surface layer of the semiconductor substrate 5.

A horizontal charge transfer channel 41 has the structure that an n-type region 41a and an n⁻-type region 41b are alternately disposed in the p-type well 5b.

For example, the p-type well 5b has an effective p-type impurity concentration of $10^{15}/cm^3$ to $10^{17}/cm^3$. The n-type region 41a has an effective n-type impurity concentration of $10^{16}/cm^3$ to $10^{18}/cm^3$, and the n⁻-type region 41b has an effective impurity concentration of $10^{15}/cm^3$ to $10^{17}/cm^3$. The thickness (depth) of the n-type region 41a and n⁻-type region 41b is, for example, 0.3 to 0.8 μm.

First and second horizontal transfer electrodes 43 and 44 are disposed on an electrically insulating film 7 such as a silicon oxide film, a silicon nitride film, and a lamination film of a silicon oxide film and a silicon nitride film. The second horizontal transfer electrode 44 is disposed above the n-type region 41a, and the first horizontal transfer electrode 43 is disposed above the n⁻-type region 41b.

An output gate 52 has an n-type region 52a which is an extension of the horizontal charge transfer channel 41 and a gate electrode 52b disposed on the electrically insulating film 7 above the n-type region 52a, constituting a depletion transistor.

An FD region 54 is made of an n⁺-type region formed in the p-type well 5b. The effective impurity concentrations have the relation of n⁺>n>n⁻, p⁺>p>p⁻.

FDA 56 is made of, for example, four insulated gate transistors Q1 to Q4. The gate of the transistor Q1 is connected to the FD region 54. FDA 56 is supplied with a power source voltage $V_{DD}$. FDA 56 generates an electric signal (voltage signal) corresponding to the amount of charges transferred to the FD region 54 and outputs it. The depletion transistors Q2 and Q3 function as a constant current source.

Similar to the FD region 54, a drain region 59 is made of an n⁺-type region formed in the p-type well 5b. An n-type channel region 58a is formed between the FD region and drain region, and a gate electrode 58b is disposed on the electrically insulating film 7 above the n-type channel region 58a, constituting a depletion transistor.

An electrically insulating film IF made of, for example, silicon oxide, is formed on the surface of each electrode.

A solid line PP1 in the lower area of FIG. 3 shows the potential profile when the negative pulse voltage train ϕH1 has the high level (0 V) and the negative pulse voltage train ϕH2 has the low level (−3 V).

The potential of the n⁻-type region 41b under the first horizontal transfer electrode 43 applied with the low level ϕH2 is about 1.5 V and the potential of the n-type region 41a under the second horizontal transfer electrode 44 is about 3.0 V.

The potential of the n⁻-type region 41b under the first horizontal transfer electrode 43 applied with the high level ϕH1 is about 4.2 V and the potential of the n-type region 41a under the second horizontal transfer electrode 44 is about 5.7 V. The n-type region 41a functions as a charge accumulation region.

In order to transfer charges from the horizontal charge transfer device 40 to the FD region 54, first the most downstream n-type region 41a is made to function as the charge accumulation region to distribute the charges once in this region. At this time, the drive signal ϕH1 takes the low level (−3 V) and the drive signal ϕH2 takes the high level (0 V).

Next, when the drive signal ϕH1 takes the high level (0 V) and the drive signal ϕH2 takes the low level (−3 V), the potential profile of the horizontal charge transfer channel 41 becomes the profile shown by the solid line PP1. The charges distributed in the most downstream n-type region 41a are transferred to the FD region 54 via the output gate 52.

When the charges are transferred to the horizontal charge transfer device 40 to the FD region 54, the channel potential at the output end of the horizontal charge transfer device 40 is about 3.0 V. By setting the channel potential of the output gate 52 (potential of the n-type region 52a) to about 4.0 V, the charges can be transferred from the horizontal charge transfer device 40 to the FD region 54.

Since the charges can be transferred to the FD region 54 by setting the channel potential at the output gate 52 to about 4.0 V, the output dynamic range of the charge detector circuit 50 can be made sufficiently broad by setting the power source voltage $V_{DD}$ to be supplied to the drain region 59 to about 6 V to thereby set the reference potential of the FD region 54 to about 6 V. Even if the threshold voltage of FDA 56 (threshold voltage of the transistor Q1) is 0 V same as the conventional circuit, the power source voltage $V_{DD}$ of 6 V can be used as an input voltage to FDA 56.

If the horizontal charge transfer device is driven by positive pulse voltage trains, it is necessary to raise the reference potential of the FD region 54.

A dotted chain line PP2 in the lower area of FIG. 3 shows the potential profile when the horizontal charge transfer device 40 is driven by two-phase positive pulse voltage trains.

The potential profile PP2 is obtained when a positive voltage pulse train ϕH11 takes the high level (e.g., 3 V) and a positive voltage pulse train ϕH12 takes the low level (e.g., 0 V). The impurity concentration of each region is similar to that when the potential profile PP1 is obtained.

However, as will be later described with reference to FIGS. 4A and 4B, the horizontal charge transfer device showing the solid line potential profile PP1 and the horizontal charge transfer device showing the dotted chain line potential profile PP2 have different channel potential—electrode voltage characteristics.

In the case of the channel profile PP2, when the charges are transferred from the horizontal charge transfer device 40 to the FD region 54, the channel potential at the output end of the horizontal charge transfer device 40 is about 8.5 V. In order to transfer the charges from the horizontal charge transfer device 40 to the FD region 54, it is necessary to set the channel potential of the output gate 52 (potential of the n-type region 52a) to about 10.0 V.

Since the charges can be transferred to the FD region 54 at about 10.0 V of the channel potential of the output gate 52, it is desired to set the power source voltage $V_{DD}$ to be supplied to the drain region 59 to about 12 V or higher to thereby set the reference voltage of the FD region 54 to about 12 V or higher. The power source voltage $V_{DD}$ of about 12 V or higher becomes an input voltage to FDA 56.

Since an input voltage (power source voltage $V_{DD}$) to the FDA 56 is about 12 V or higher, a power consumption of the charge detector circuit 50 when the horizontal charge transfer device 40 is driven by the positive pulse voltage trains is about twice that when the horizontal charge transfer device 40 is driven by the negative pulse voltage trains.

By driving the horizontal charge transfer device 40 by the negative pulse voltage trains, the consumption power of the charge detector circuit 50 can be reduced by about a half.

In order to improve productivity of the solid state image pickup device 1, it is desired to form the vertical charge transfer channels 21 (refer to FIG. 1) and n-type regions 41a in the horizontal charge transfer channel 41 by a single process. The n-type impurity concentration of the vertical charge transfer channel 21 becomes approximately equal to that of the n-type regions 41a of the horizontal charge transfer device 40.

Each of the negative pulse voltage trains ϕV1 to ϕV4 to be generated by the second drive circuit 90 (refer to FIG. 1) in order to drive the vertical charge transfer devices 20 has preferably the low level of about −4.5 to −5 V and the high level of 0 V.

Figure 4A:
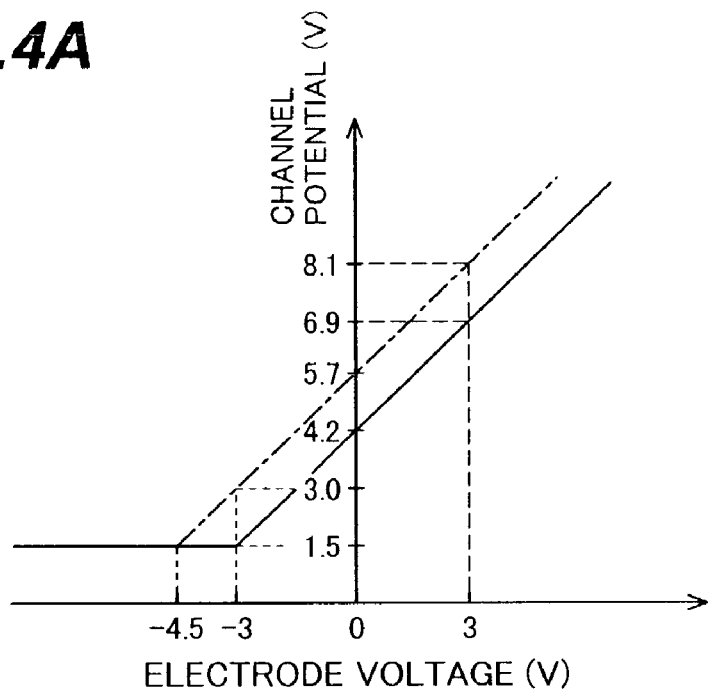
FIG. 4A is a graph showing the relation between the channel potential of the horizontal charge transfer device shown in FIG. 3 and the voltage applied to first and second horizontal transfer electrodes.

FIG. 4A is a graph showing the relation between the channel potential of the horizontal charge transfer device 40 and voltages applied to the first and second horizontal transfer electrodes 43 and 44 to obtain the potential profile PP1 shown in the lower area of FIG. 3. In FIG. 4A, a dotted chain line shows the potential of the n-type region 41a and a solid line shows the potential of the n⁻-type region 41b. In FIG. 4A, the voltages applied to the first and second horizontal transfer electrodes 43 and 44 are labeled as "electrode voltage".

As the electrode voltage becomes lower than about −4.5 V (as the absolute value becomes larger than about 4.5), a hole inversion layer is formed in the surface layer and its nearby region of the n-type region 41a so that the surface potential becomes 0 and the potential of the n-type region 41a is fixed (pinned) to about 1.5 V. Similarly, as the electrode voltage becomes lower than about −3 V, a hole inversion layer is formed in the surface layer and its nearby region of the n⁻-type region 41b so that the surface potential becomes 0 and the potential of the n⁻-type region 41b is fixed (pinned) to about 1.5 V.

In this specification, the potential of the transfer electrode, when the hole inversion layer is formed in the surface layer and its nearby region of the channel and the surface potential becomes 0, is called a "pinning potential".

If the vertical charge transfer channels 21 and the n-type regions 41a of the horizontal charge transfer channel 41 are formed by a single process, the n-type impurity concentration of the vertical charge transfer channel 21 becomes approximately equal to that of the n-type region 41a. The pinning potential of the vertical charge transfer channel 21 is also about −4.5 V.

When the charge transfer device is driven by negative pulse voltage trains, the potential of the low level of the negative pulse voltage train is preferably set to the pinning potential or a potential near the pinning potential, i.e., a potential in the range of about ±2 V from the pinning potential.

Figure 4B:
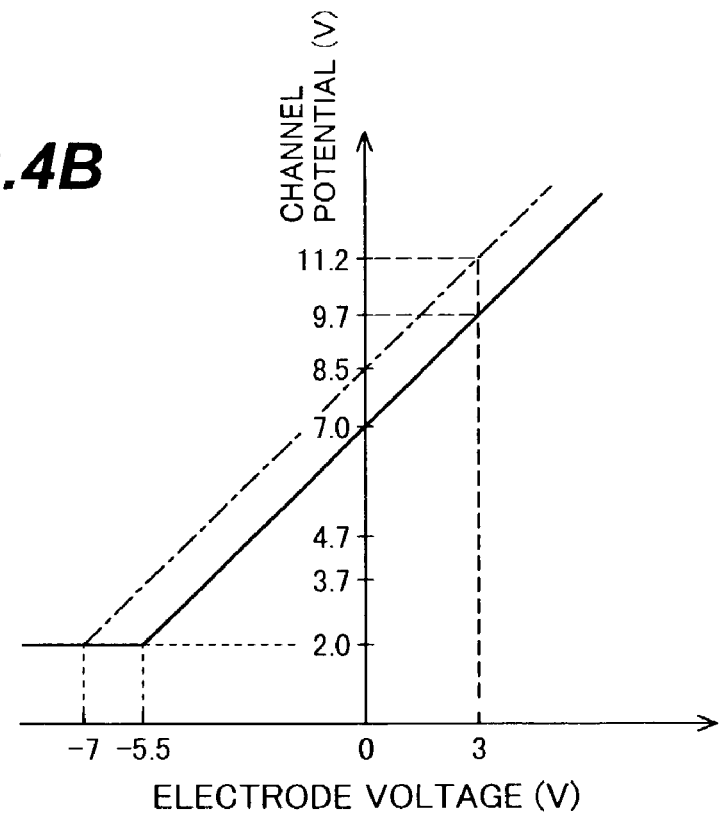
FIG. 4B is a graph showing the relation between the channel potential of a horizontal charge transfer device driven by positive pulse voltage trains and the voltage applied to the first and second horizontal transfer electrodes.

FIG. 4B is a graph showing the relation between the channel potential of the horizontal charge transfer device 40 and voltages applied to the first and second horizontal transfer electrodes 43 and 44 to obtain the potential profile PP2 shown in the lower area of FIG. 3. In FIG. 4B, a dotted chain line shows the potential of the n-type region 41a and a solid line shows the potential of the n⁻-type region 41b. Also in FIG. 4B, the voltages applied to the first and second horizontal transfer electrodes 43 and 44 are labeled as "electrode voltage".

As seen from FIG. 4B, the pinning potential of the n-type region 41a is about −7 V and the pinning potential of the n⁻-type region 41b is about −5.5 V. As compared to FIG. 4A, the drive voltage becomes higher and the consumption power becomes larger.

Next, a solid state image pickup apparatus according to the second embodiment will be described.

Figure 5:
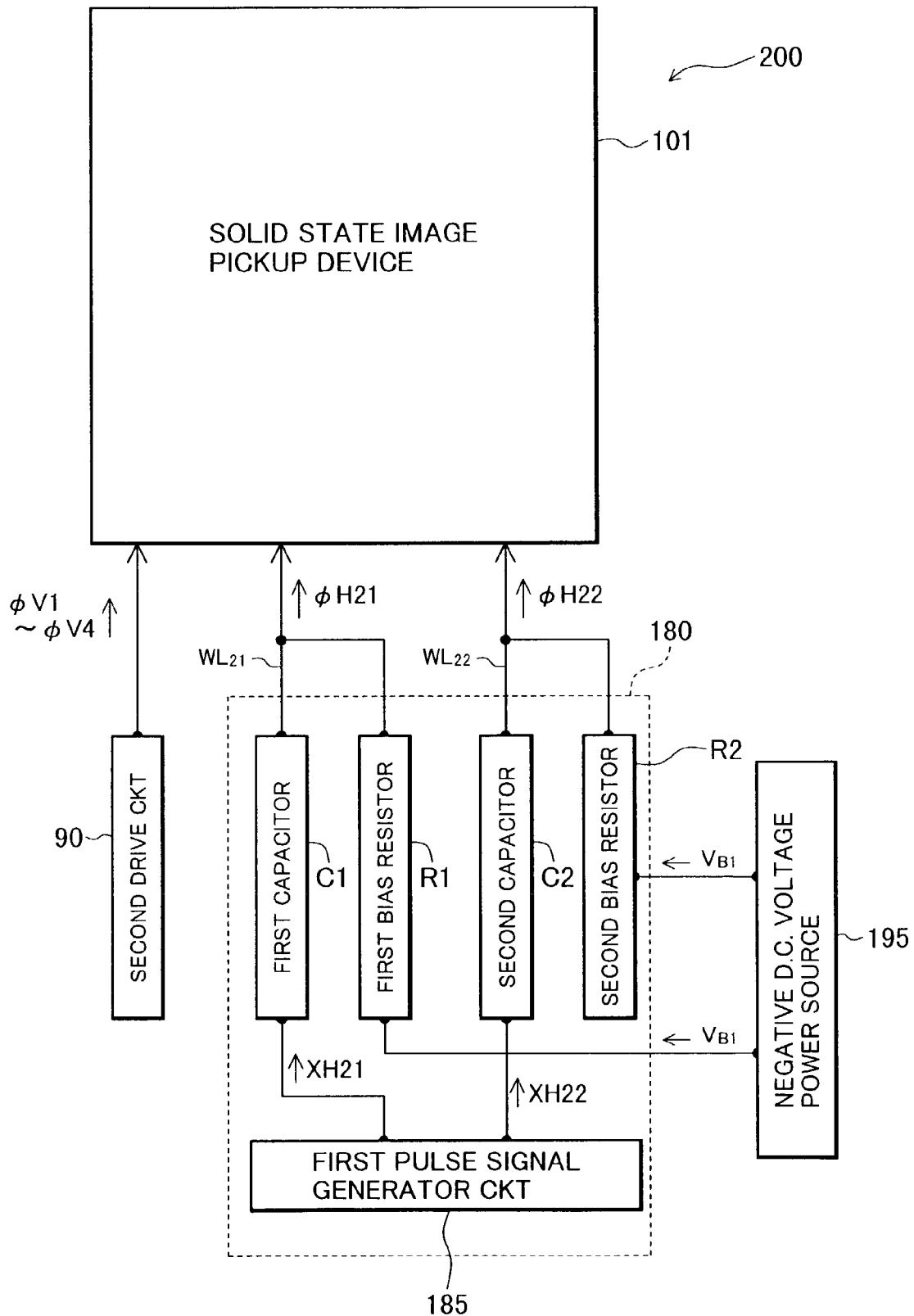
FIG. 5 is a block diagram showing the outline of a solid image pickup apparatus according to a second embodiment.

FIG. 5 is a block diagram showing the outline of a solid state image pickup apparatus 200 of the second embodiment. A second drive circuit 90 of the solid state image pickup apparatus 200 has the same function as that of the second drive circuit 90 shown in FIG. 1. The structures of a solid state image pickup device 101 and first drive circuit 180 of the solid state image pickup apparatus 200 are different from those of the solid state image pickup device 1 and first drive circuit 80 shown in FIG. 1.

The structure of a horizontal charge transfer channel of the solid state image pickup device 101 is different from that of the horizontal charge transfer channel 41 shown in FIG. 1. Different points will be later detailed with reference to FIG. 7.

The first drive circuit 180 has a first signal generator circuit 185, first and second capacitors C1 and C2, and first and second bias resistors R1 and R2.

The first pulse signal generator circuit 185 generates two-phase positive pulse trains XH21 and XH22 having inverted waveforms of the waveforms of the negative pulse voltage trains φH1 and φH2 generated by the first drive circuit 80 shown in FIG. 1. The positive pulse voltage trains XH21 and XH22 have opposite phases, and, for example, the high level potential of 3 V and the low level potential of 0 V.

The positive pulse voltage train XH21 is supplied to the first capacitor C1, and the positive pulse voltage train XH22 is supplied to the second capacitor C2. Each of the first and second capacitors C1 and C2 has a capacitance sufficiently larger than the total capacitance relative to earth of all horizontal transfer electrodes of the horizontal charge transfer device.

Although the first and second capacitors C1 and C2 can be formed on the semiconductor substrate of the solid state image pickup device 101, the first and second capacitors C1 and C2 are relatively large in size. Therefore, the first and second capacitors C1 and C2 are preferably formed outside of the solid state image pickup device 101 as shown in FIG. 5 from the viewpoint of manufacture efficiency. For example, the first and second capacitors C1 and C2 are connected to connection pins of a package of the solid state image pickup device 101.

The first and second bias resistors R1 and R2 are supplied with a negative vias voltage $V_{B1}$, e.g., −4 V from a negative d.c. voltage power source 195. One end of the first bias resistor R1 is electrically connected to a wiring line $WL_{21}$ connecting the first capacitor C1 and horizontal charge transfer device. One end of the second bias resistor R2 is electrically connected to a wiring line $WL_{22}$ connecting the second capacitor C2 and horizontal charge transfer device.

A negative offset voltage is therefore superposed upon the positive pulse voltage trains XH21 and XH22. The positive pulse voltage trains XH21 and XH22 are therefore changed to negative pulse voltage trains φH21 and φH22 which are supplied to the horizontal charge transfer device.

Figure 6:
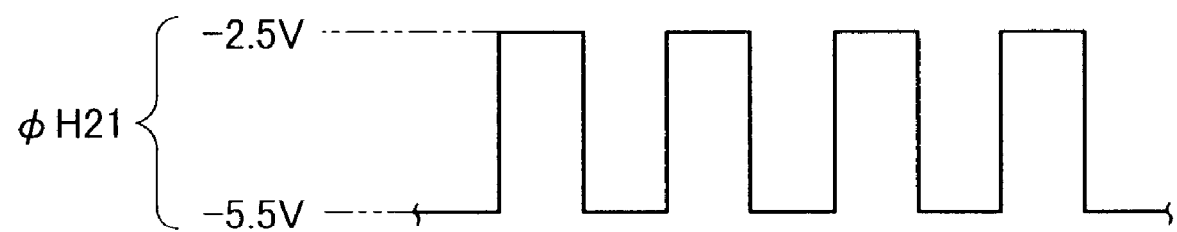
FIG. 6 is a diagram showing the waveform of one of two-phase negative pulse voltage trains generated by a first drive circuit shown in FIG. 5.

FIG. 6 shows the waveform of the negative pulse voltage train φH21. For example, the high level potential of the negative pulse voltage train φH21 is −2.5 V and the low level potential is −5.5 V. The duty ratio is about 50%. The negative pulse voltage train φH22 has an opposite phase to that of the negative pulse voltage train φH21, and the high level potential, low level potential and duty ratio are the same as those of the negative pulse voltage train φH21.

Figure 7:
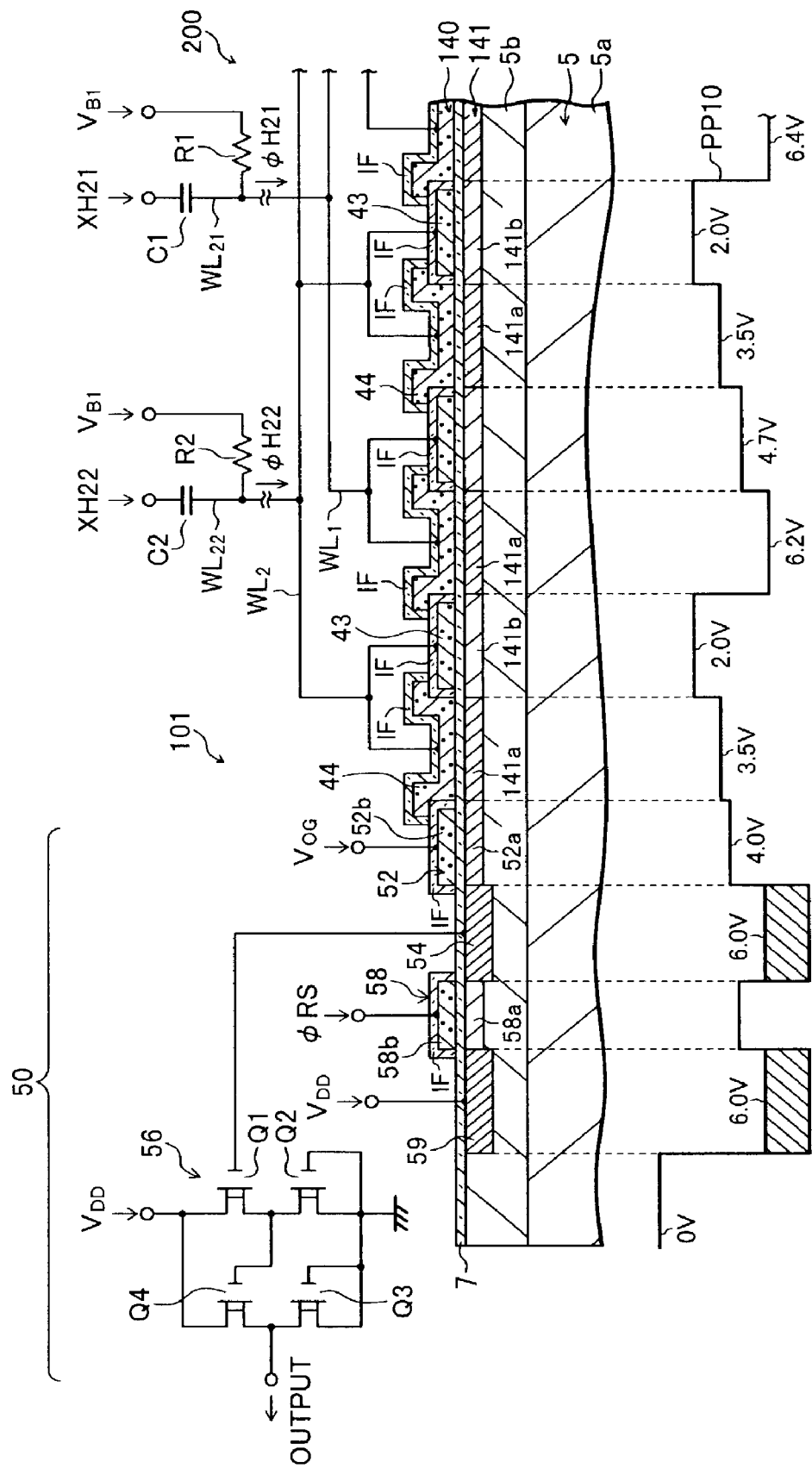
FIG. 7 is a cross sectional view showing the structure of the solid state image pickup apparatus from the horizontal charge transfer element to a charge detector circuit shown in FIG. 5 and a schematic diagram of a potential profile.

FIG. 7 is a schematic cross sectional view of the structure from the horizontal charge transfer device 40 to charge detector circuit 50 of the solid state image pickup and shows a potential profile. In FIG. 7, elements similar to those shown in FIG. 3 or 5 are represented by using identical reference numerals, and the description thereof is omitted.

A horizontal charge transfer channel 141 of the horizontal charge transfer device 140 has n-type regions 141a and n⁻-type regions 141b. An n-type impurity concentration of the n-type region 141a is higher than an n-type impurity concentration of the n-type region 41a shown in FIG. 3. Similarly, an n-type impurity concentration of the n⁻-type region 141b is higher than an n-type impurity concentration of the n⁻-type region 41b shown in FIG. 3. The n-type impurity concentration of each region corresponds to the impurity concentration which shows the potential profile PP2 shown in FIG. 3.

A solid line PP10 shown in FIG. 7 shows the potential profile when the negative pulse voltage train φH21 has the high level (−2.5 V) and the negative pulse voltage train φH22 has the low level (−5.5 V). As shown, the channel potential at the output end of the horizontal charge transfer device 140 when charges are transferred from the horizontal charge transfer device 140 to FD region 54 is about 3.5 V. If the channel potential of the output gate 52 (potential in the n-type region 52*a*) is set to about 4.0 V, the charges can be transferred from the horizontal charge transfer device 140 to FD region 54.

Even if the power source voltage $V_{DD}$ to be supplied to the drain region 59 is set to about 6 V to set the reference potential of the FD region 54 to about 6 V, charges can be received from the horizontal charge transfer device 140 via the output gate 52. An output dynamic range of the charge detector circuit 50 can be made sufficiently broad. Even if the threshold voltage (threshold voltage of the transistor Q1) is set to 0 V same as the conventional circuit, the power source voltage $V_{DD}$ of about 6 V is sufficient for an input voltage to FDA 56.

Similar to the solid state image pickup apparatus 100 shown in FIG. 1, the consumption power of the charge detector circuit 50 of the solid state image pickup apparatus 200 can be reduced by about a half of that when the horizontal charge transfer device 140 is driven by positive pulse voltage trains.

Next, a solid state image pickup apparatus according to the third embodiment will be described with reference to FIGS. 8 to 10.

Figure 8:
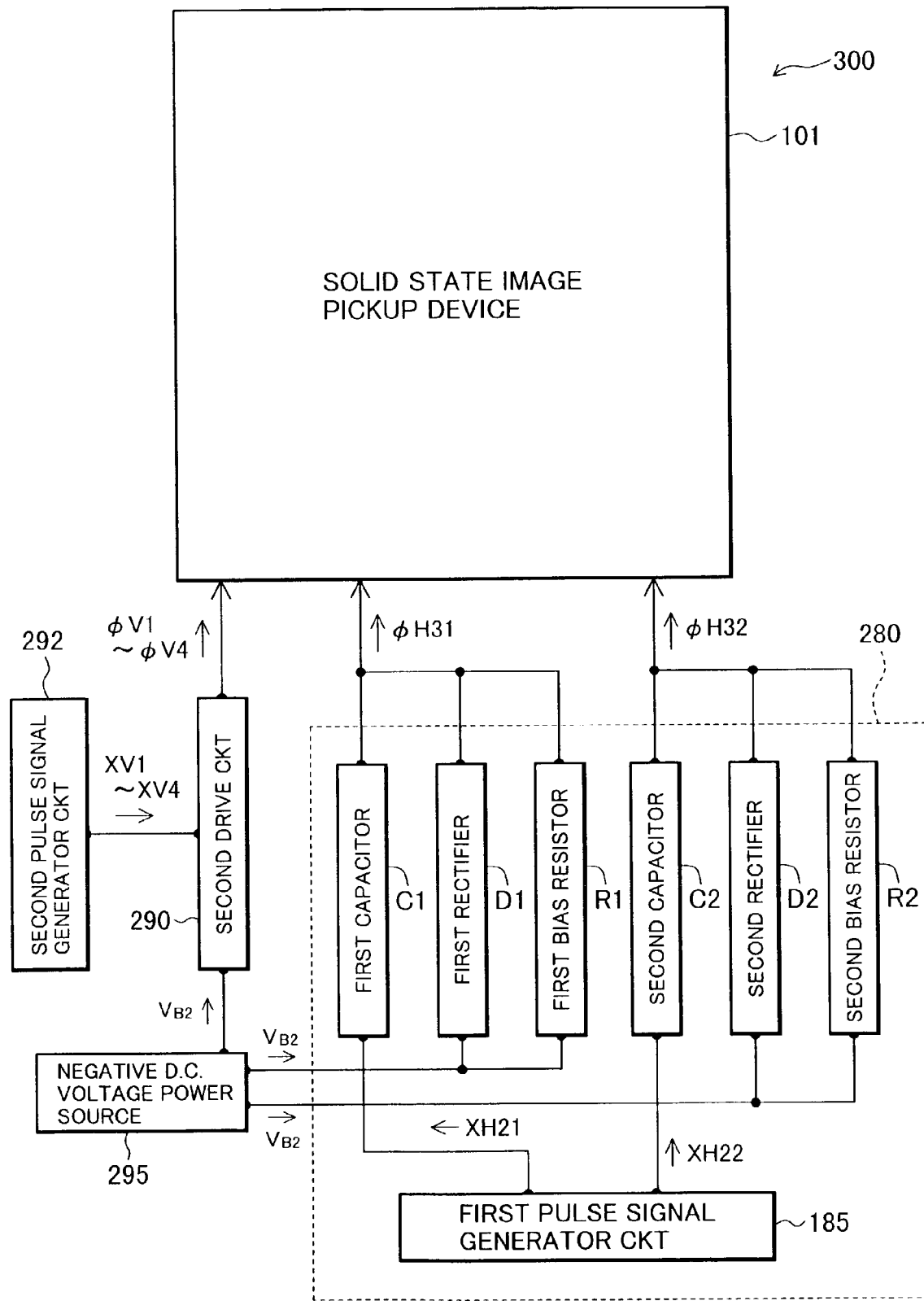
FIG. 8 is a block diagram showing the outline of a solid image pickup apparatus according to a third embodiment.

FIG. 8 is a block diagram showing the outline of a solid state image pickup apparatus 300 of the third embodiment.

Figure 9:
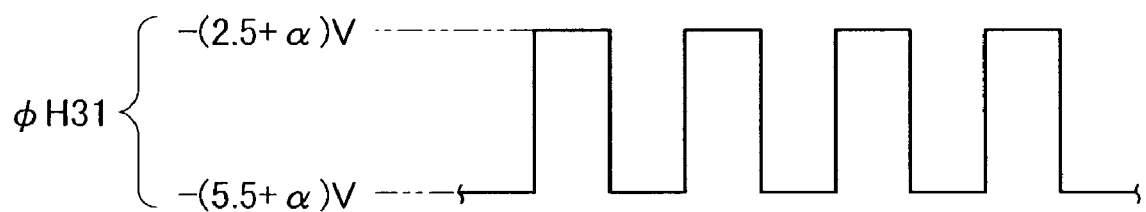
FIG. 9 is a diagram showing the waveform of one of two-phase negative pulse voltage trains generated by a first drive circuit shown in FIG. 8.

FIG. 9 shows the waveform of a negative pulse voltage train φH31 generated by a first drive circuit 280 shown in FIG. 8.

Figure 10:
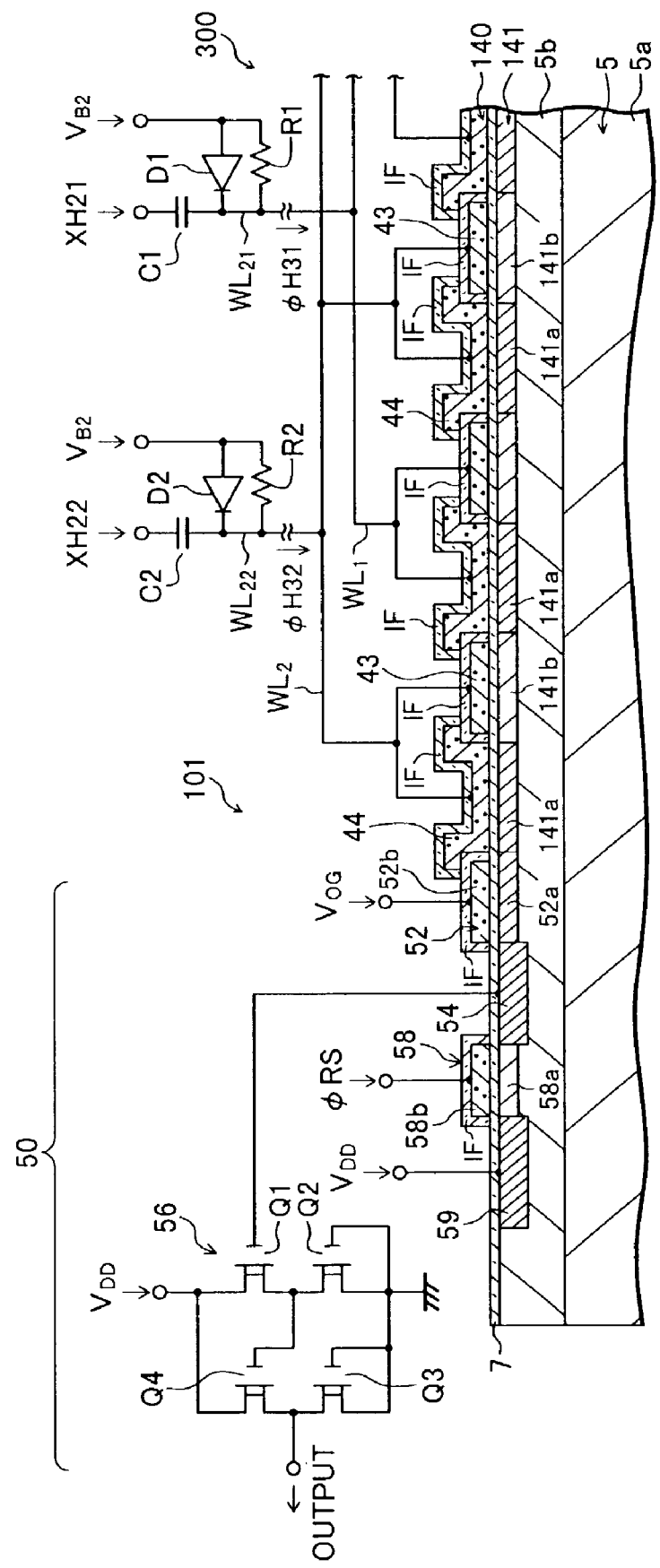
FIG. 10 is a cross sectional view showing the structure of the solid state image pickup apparatus from the horizontal charge transfer element to a charge detector circuit shown in FIG. 8 and a schematic diagram of a potential profile.

FIG. 10 is a schematic cross sectional view of the structure from a horizontal charge transfer device 140 to a charge detector circuit 50 of a solid image pickup device 101 shown in FIG. 8 and shows a potential profile.

In FIG. 8 or 10, elements similar to those shown in FIG. 5 or 7 are represented by using identical reference numerals, and the description thereof is omitted.

As shown in FIGS. 8 and 10, the solid state image pickup apparatus 300 has the first drive circuit 280. In the first drive circuit 280, a first rectifier D1 is disposed in parallel to a first bias resistor R1, a second rectifier D2 is disposed in parallel to a second bias resistor R2, and a negative d.c. voltage power source 295 supplies a negative bias voltage $V_{B2}$ of −5.5 V to the first and second bias resistors R1 and R2 and first and second rectifiers D1 and D2. The first and second rectifiers D1 and D2 are connected in such directions that a forward current flows therethrough when the negative electrodes thereof are connected to the solid state image pickup device 101.

As shown in FIG. 9, the first drive circuit 280 generates a negative pulse voltage train φH31 having the high level potential of −(2.5+α) V slightly lower than −2.5 V and the low level potential of −(5.5+α) V slightly lower than −5.5 V. A negative pulse voltage train φH32 having an opposite phase to that of the negative pulse voltage train φH31 is also generated.

A second drive circuit 290 of the solid state image pickup apparatus 300 generates four-phase negative pulse voltage trains φV1 to φV4 for driving the vertical charge transfer devices 20 (refer to FIG. 1), by using four-phase positive pulse voltage trains XV1 to XV4 supplied from a second pulse signal generator circuit 292 and a negative bias voltage $V_{B2}$ supplied from a negative d.c. voltage power source 295.

The positive pulse voltage trains XV1 to XV4 generated by the second pulse signal generator circuit 292 have the inverted waveforms of the waveforms of the negative pulse voltage trains φV1 to φV4 generated by the second drive circuit 90 shown in FIG. 1. For example, the positive pulse voltage trains XV1 to XV4 have the high level potential of 7 V and the low level potential of 0 V.

The structure of the solid state image pickup apparatus 300 is similar to that of the solid state image pickup apparatus 200 of the second embodiment, excepting the above described different points.

Similar to the solid state image pickup apparatus 100 shown in FIG. 1, the consumption power of the charge detector circuit 50 of the solid state image pickup apparatus 300 can be reduced by about a half of that when the horizontal charge transfer device 140 is driven by positive pulse voltage trains.

Since the first drive circuit 280 of the solid state image pickup apparatus 300 has the first and second rectifiers D1 and D2, the low level potential of the negative pulse voltage trains φH31 and φH32 can be stabilized while the predetermined amplitude is retained, by clipping the low level potential to the negative bias voltage $V_{B2}$ generated by the negative d.c. voltage power source 295.

As shown in FIG. 8, if the negative bias voltage $V_{B2}$ is set to −5.5 V, this bias voltage $V_{B2}$ can be used also for generating the low level of the negative pulse voltage trains φV1 go φV4 for the vertical charge transfer devices 20. The solid state image pickup apparatus which drives the horizontal charge transfer device by negative pulse voltage trains can be realized without increasing the number of power sources supplying respective voltages more than the number of power sources of a conventional solid state image pickup apparatus which drives the horizontal charge transfer device by positive pulse voltage trains. Next, a solid state image pickup apparatus according to the fourth embodiment will be described with reference to FIGS. 11 to 13.

Figure 11:
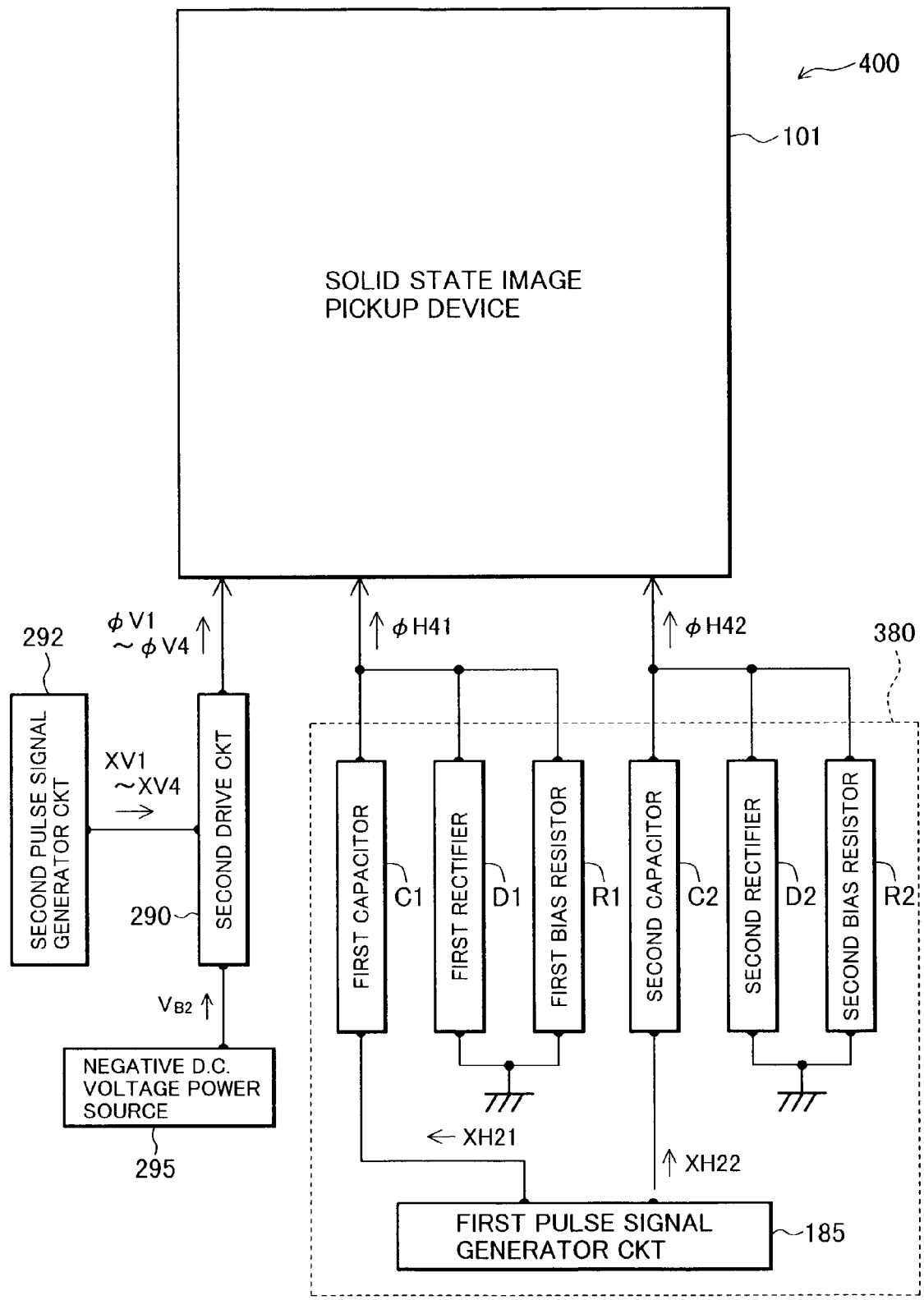
FIG. 11 is a block diagram showing the outline of a solid image pickup apparatus according to a fourth embodiment.

FIG. 11 is a block diagram showing the outline of a solid state image pickup apparatus 400 of the fourth embodiment.

Figure 12:
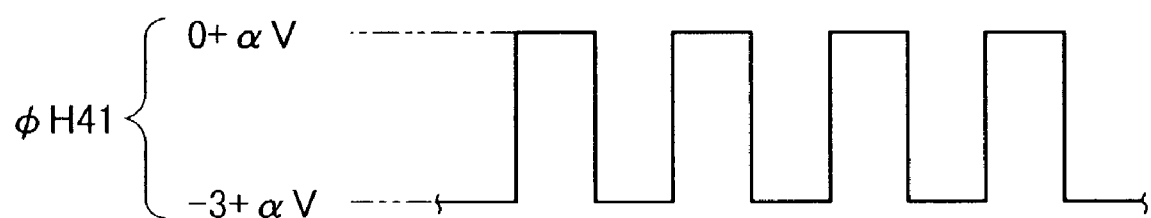
FIG. 12 is a diagram showing the waveform of one of two-phase negative pulse voltage trains generated by a first drive circuit shown in FIG. 11.

FIG. 12 shows the waveform of a negative pulse voltage train φH41 generated by a first drive circuit 380 shown in FIG. 11.

Figure 13:
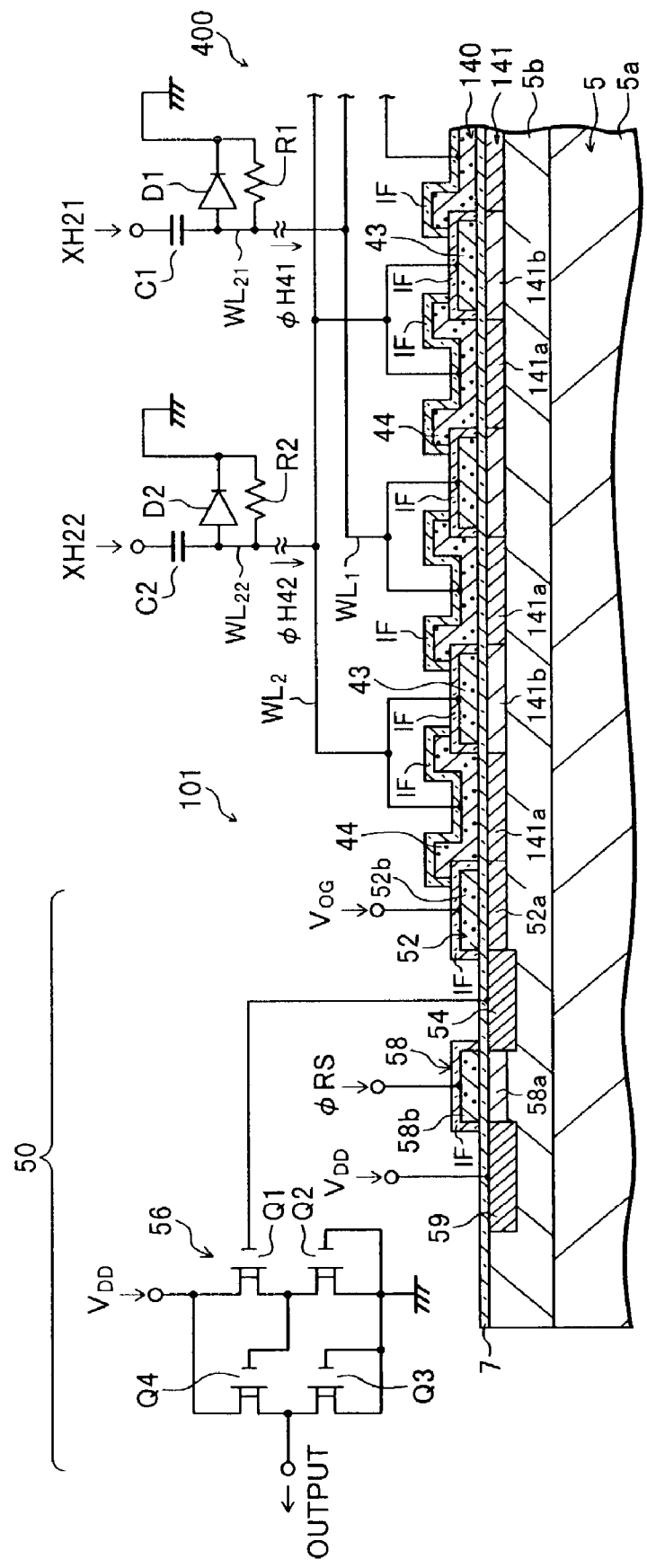
FIG. 13 is a cross sectional view showing the structure of the solid state image pickup apparatus from the horizontal charge transfer element to a charge detector circuit shown in FIG. 11 and a schematic diagram showing a potential profile.

FIG. 13 is a schematic cross sectional view of the structure from a horizontal charge transfer device 140 to a charge detector circuit 50 of a solid image pickup device 101 shown in FIG. 11.

In FIG. 11 or 13, elements similar to those shown in FIG. 8 or 10 are represented by using identical reference numerals, and the description thereof is omitted.

As shown in FIGS. 11 and 13, the solid state image pickup apparatus 400 has the first drive circuit 380. In the first drive circuit 380, first and second bias resistors R1 and R2 and first and second rectifiers D1 and D2 are grounded and the first and second rectifiers D1 and D2 are connected in such directions that a forward current flows therethrough when the positive electrodes thereof are connected to the solid state image pickup device 101. Therefore, a d.c. bias voltage of a ground potential is applied to the first and second bias resistors R1 and R2 and first and second rectifiers D1 and D2.

As shown in FIG. 12, the first drive circuit 380 generates a negative pulse voltage train φH41 having the high level potential of (0+α) V slightly higher than 0 V and the low level potential of (−3+α) V slightly higher than −3 V. A negative pulse voltage train φH42 having an opposite phase to that of the negative pulse voltage train φH41 is also generated.

The structure of the solid state image pickup apparatus 400 is similar to that of the solid state image pickup apparatus 300 of the third embodiment, excepting the above described different points.

Similar to the solid state image pickup apparatus 100 shown in FIG. 1, the consumption power of the charge detector circuit 50 of the solid state image pickup apparatus 400 can be reduced by about a half of that when the horizontal charge transfer device 140 is driven by positive pulse voltage trains.

Since the first and second rectifiers D1 and D2 are connected in the above-described directions, the high level potential of the negative pulse voltage trains φH41 and φH42 can be stably set to the ground potential.

Next, a solid state image pickup apparatus of the fifth embodiment will be described.

FIG. 14 is a schematic diagram showing a solid state image pickup apparatus 500 of the fifth embodiment. As seen from FIG. 14, this solid state image pickup apparatus 500 can be used as a linear image sensor and has a solid state image pickup device 50 and a first drive circuit 480.

The solid state image pickup device 50 has a semiconductor substrate 405, a number of photoelectric conversion elements 410 disposed in line on one surface of the semiconductor substrate 405, a read gate 430 provided for each photoelectric conversion element 410, a charge transfer device 440 electrically connected to the read gates 430, a charge detector circuit 450 electrically connected to an output end of the charge transfer device 440, and a lateral overflow drain 460 electrically connected to the photoelectric conversion elements 410.

The semiconductor substrate 405 has the structure, for example, similar to that of the semiconductor substrate 5 shown in FIG. 3.

Each photoelectric conversion element 410 is made of, for example, a buried type photodiode. The actual number of photoelectric conversion elements 410 are several hundreds to several millions.

Each read gate 430 has, for example, a p-type well region formed in the semiconductor substrate 405 and a read gate electrode formed on an electrically insulating film above the p-type well. The gate electrode of the read gate 430 is made of each region of a single gate electrode 435. The operation of each read gate is controlled by a drive signal φR supplied to the gate electrode 435. In FIG. 14, each read gate 430 is shown hatched.

The charge transfer device 440 is made of a two-phase drive type CCD. The structure of the charge transfer device 440 is similar to that of the horizontal charge transfer device 40 shown in FIG. 3 or the horizontal charge transfer device 140 shown in FIG. 7. The charge transfer device 440 has a horizontal charge transfer channel 441 alternately disposing an n-type region and an n⁻-type region, and a number of horizontal transfer electrodes 445 disposed on an electrically insulating film above the horizontal charge transfer channel 441.

Pairs of adjacent two horizontal transfer electrodes 445 are connected in common similar to the previously described embodiments. The pairs are classified into two groups. One group is connected to a pad P1 by a wiring line $WL_{31}$, and the other group is connected to a pad P2 by a wiring line $WL_{32}$.

The charge detector circuit 450 has the structure, for example, similar to that of the charge detector circuit 50.

The lateral overflow drain 460 has a drain region 462 formed in the semiconductor substrate 405 at a position spaced apart from the photoelectric conversion element row, a channel region between the row of the photoelectric conversion elements 410 and the drain region 462, and a drain gate electrode 464 formed on an electrically insulating film above the channel region and extending along the photoelectric conversion element row.

The lateral overflow drain 460 drains charges from each photoelectric conversion element 410 to the drain region 462 in response to a drive signal φOFD applied to the draining gate electrode 464.

The first drive circuit 480 has the structure similar to that of the first drive circuit 80 shown in FIG. 1, the first drive circuit 180 shown in FIG. 5, the first drive circuit 280 shown in FIG. 8 or the first drive circuit 380 shown in FIG. 11, depending upon the structure of the charge transfer device 440.

The first drive circuit 480 generates two-phase negative pulse voltage trains for driving the charge transfer device 440. One negative pulse voltage train is supplied via a wiring line $WL_{41}$ to the pad P1, and the other negative pulse voltage train is supplied via a wiring line $WL_{42}$ to the pad P2.

From the same reason why the consumption power of the solid state image pickup apparatus 100 shown in FIG. 1 can be reduced, the consumption power of the charge detector circuit 450 of the solid state image pickup apparatus 440 can be reduced more than when the charge transfer device 440 is driven by positive pulse voltage trains.

The solid state image pickup apparatuses and their driving methods of the embodiments have been described above. The invention is not limited only to the above-described embodiments.

For example, the charge transfer device whose output end is connected to the charge detector circuit is not limited to the charge transfer device made of a two-phase drive type CCD. The charge transfer device may be made of CCD's of various drive types such as a three-phase drive type and a four-phase drive type. By driving these charge transfer devices by negative pulse voltage trains, the consumption power of the charge detector circuit can be reduced.

The charge transfer channel of a charge transfer device driven by drive signals (pulse voltage trains) of three or more phases has an approximately uniform impurity concentration over the whole length thereof. The impurity concentration and distribution of the charge transfer channel of a charge transfer device whose output end is connected to a charge detector circuit may be properly selected depending upon the number of drive phases of the charge transfer device, application fields of a solid state image pickup device having such a charge transfer device, and the like. The relation between the voltage applied to the transfer electrode and the channel potential under the transfer electrode is not limited only to that shown in FIG. 4A, but it may be properly selected.

An amplitude of a negative pulse voltage train for driving a charge transfer device whose output end is connected to a charge detector circuit may be properly selected depending upon the impurity concentration and distribution of the charge transfer channel, the number of drive phases of the charge transfer device, application fields of a solid image pickup device having such a charge transfer device, and the like.

The structure of a charge detector circuit is not limited to those of the embodiments.

The charge transfer device and the charge detector circuit connected to the output end of the charge transfer device are preferably formed in the same semiconductor substrate. Instead, they may be formed in difference semiconductor substrates when necessary. A protection circuit may be formed for the charge transfer device and charge detector circuit when necessary.

A solid state image pickup device having the charge transfer device whose output end is connected to a charge detector circuit may be used as an area image sensor or a linear image sensor of either full color or black and white. It may also be used as a compact linear sensor of a range finding system in an autofocussing camera or the like.

In a solid state image pickup device for an area or linear image sensor, an output signal from the charge detector circuit is utilized for generating image reproducing data. In a range finding system, a pair of solid state image pickup devices is disposed at a predetermined distance, and range finding data is generated by comparing the signals output from the two solid state image pickup devices (charge detector circuits).

The layout of components of a solid state image pickup device can be selected in various ways depending upon applications of the solid state image pickup device, requested performance of the device, and the like.

A charge transfer device may be used as a delay element. For example, in the structure shown in FIG. 14, a delay element can be realized by omitting the photoelectric conversion elements 410, read gates 430, charge detector circuit 450 and lateral overflow drain 460.

A delay time of the delay element can be set by adjusting the number of charge transfer stages of the delay element (charge transfer device). A charge transfer stage of a charge transfer device made of a two-phase drive type CCD is constituted of four transfer electrodes and four impurity doped regions under these transfer electrodes. By driving the delay element by negative pulse voltage trains, the consumption power of a circuit connected to the output end of the delay element can be reduced.

It is apparent that various modifications, improvements, combinations, and the like can be made by those skilled in the art.

The invention claimed is:

1. A solid state image pickup apparatus comprising:
   a semiconductor substrate;
   a number of photoelectric conversion elements formed in one surface of said semiconductor substrate in a matrix shape with a plurality of rows and columns, each of said photoelectric conversion elements accumulating charges corresponding to an amount of incidence light;
   a first charge transfer device for receiving charges accumulated in each of said photoelectric conversion elements and transferring the charges in a predetermined direction by being driven by pulse voltage trains of a plurality of phases, said first charge transfer device comprising: an electrically insulating film formed on the surface of said semiconductor substrate; a plurality of transfer electrodes disposed in line on the insulating film, said transfer electrodes being classified into a plurality of groups and connected in common in groups; and an n-type charge transfer channel formed in the surface of said semiconductor substrate and traversing each of said transfer electrodes, the n-type charge transfer channel including accumulation regions and barrier regions alternately disposed along the length of the n-type charge transfer channel, a concentration of conductivity-determining impurity in said accumulation regions and in said barrier regions of said n-type charge transfer channel being set to such a level that a potential of said n-type charge transfer channel takes a pinning potential when a predetermined negative voltage is applied to said transfer electrodes;
   a charge detector circuit electrically connected to an output end of said first charge transfer device for detecting charges output from said first charge transfer device and generating an electrical signal;
   a first drive circuit for generating pulse voltage trains of a plurality of phases each taking the predetermined negative voltage or a negative voltage near the predetermined negative voltage as a low level;
   a second charge transfer device comprising: a plurality of vertical charge transfer channels formed in the surface of said semiconductor substrate, each vertical charge transfer channel extending along a photoelectric conversion elements column and having an impurity concentration approximately equal to that of the accumulation regions of the charge transfer channel in the first charge transfer device; and a plurality of transfer electrodes disposed on an electrically insulating film formed above the surface of said semiconductor substrate and traversing the vertical charge transfer channels, said second charge transfer device transferring charges to said first charge transfer device by being driven by negative pulse voltage trains of a plurality of phases each having a negative voltage as a low level voltage;
   a second drive circuit electrically connected to said second charge transfer device for generating the negative pulse voltage trains of a plurality of phases to be used for driving said second charge transfer device,
   wherein the pulse voltage trains generated by the first drive circuit and the negative pulse voltage trains generated by the second drive circuit have a high level of ground potential.

2. The solid state image pickup device according to claim 1, wherein said negative pulse voltage trains generated by the second drive circuit have a low level lower than said pulse voltage trains generated by the first drive circuit.

3. The solid state image pickup device according to claim 1, wherein said second charge transfer channel and said accumulation regions of said n-type charge transfer channel have an n-type impurity concentration of $10^{16}$ cm$^{-3}$ to $10^{18}$ cm$^{-3}$.

4. The solid state image pickup device according to claim 1, wherein said barrier regions of said n-type charge transfer channel have an effective n-type impurity concentration of $10^{15}$ cm$^{-3}$ to $10^{17}$ cm$^{-3}$.

5. The solid state image pickup device according to claim 1, wherein the pulse trains generated by the first drive circuit have a high level of ground potential and a low level of −3V,
   wherein said second charge transfer channel and said accumulation regions of said n-type charge transfer channel have an n-type impurity concentration of $10^{16}$ cm$^{-3}$ to $10^{18}$ cm$^{-3}$.

6. The solid state image pickup device according to claim 1, wherein the negative pulse trains generated by the second drive circuit have a high level of ground potential and a low level of −4.5V,
   wherein said barrier regions of said n-type charge transfer channel have an effective n-type impurity concentration of $10^{15}$ cm$^{-3}$ to $10^{17}$ cm$^{-3}$.

7. A solid state image pickup device comprising:
   a semiconductor substrate having a first region of a first conductivity type;
   a second region of a second conductivity type opposite to said first conductivity type, formed on said first region in said semiconductor substrate;

a multiplicity of third regions of said first conductivity type formed in said second region, in a row-and-column matrix configuration;

a plurality of vertical charge transfer channels of said first conductivity type formed in said second region adjacent to respective columns of said third regions;

vertical charge transfer electrodes disposed above said vertical charge transfer channels;

a horizontal charge transfer channel of said first conductivity type formed in said second region electrically coupled to said vertical charge transfer channels, and including a plurality of pairs of barrier regions and well regions;

horizontal charge transfer electrodes disposed above said barrier regions and said well regions of said horizontal charge transfer channel, each electrode disposed above a well region of a pair being electrically connected with an adjacent electrode disposed above the barrier region of the pair;

a vertical drive circuit for supplying a multi-phase driving signal to said vertical charge transfer electrodes, including a first negative pulse train; and a horizontal drive circuit for supplying a two-phase driving signal to said horizontal charge transfer electrodes, including a second negative pulse train;

wherein said vertical charge transfer channel and said well regions of the horizontal charge transfer channel have approximately equal impurity concentration.

8. The solid state image pickup device according to claim 7, wherein said first conductivity type is n-type, and said second conductivity type is p-type.

9. The solid state image pickup device according to claim 7, wherein said first and second negative pulse trains have a high level of ground potential.

10. The solid state image pickup device according to claim 9, wherein said first negative pulse train has a low level lower than said second negative pulse train.

11. The solid state image pickup device according to claim 8, wherein said vertical charge transfer channel and said well regions of the horizontal charge transfer channel have an n-type impurity concentration of $10^{16}$ cm$^{-3}$ to $10^{18}$ cm$^{-3}$.

12. The solid state image pickup device according to claim 11, wherein said barrier regions of said horizontal charge transfer channel have an effective n-type impurity concentration of $10^{15}$ cm$^{-3}$ to $10^{17}$ cm$^{-3}$.

13. The solid state image pickup device according to claim 11, wherein said second negative pulse train has a high level of ground potential and a low level of −3V.

14. The solid state image pickup device according to claim 13, wherein said first negative pulse train has a high level of ground potential and a low level of −4.5V.

* * * * *